(12) United States Patent
Tsuruoka

(10) Patent No.: US 10,910,464 B2
(45) Date of Patent: *Feb. 2, 2021

(54) ELECTRONIC DEVICE INCLUDING AN IC

(71) Applicant: Japan Display Inc., Minato-ku (JP)

(72) Inventor: Kazuto Tsuruoka, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/805,947

(22) Filed: Mar. 2, 2020

(65) Prior Publication Data

US 2020/0203466 A1 Jun. 25, 2020

Related U.S. Application Data

(63) Continuation of application No. 16/195,892, filed on Nov. 20, 2018, now Pat. No. 10,615,246.

(30) Foreign Application Priority Data

Nov. 27, 2017 (JP) .................................. 2017-226875

(51) Int. Cl.
*H01L 27/32* (2006.01)
*G09G 3/3266* (2016.01)
*H01L 51/50* (2006.01)
*H01L 51/52* (2006.01)

(52) U.S. Cl.
CPC ....... *H01L 27/3276* (2013.01); *G09G 3/3266* (2013.01); *H01L 27/3246* (2013.01); *H01L 27/3262* (2013.01); *H01L 51/5012* (2013.01); *H01L 51/5206* (2013.01); *H01L 51/5221* (2013.01)

(58) Field of Classification Search
CPC ............. H01L 27/3276; H01L 27/3288; H01L 51/5221; H01L 51/5012
See application file for complete search history.

(56) References Cited

U.S. PATENT DOCUMENTS

| 10,615,246 B2 * | 4/2020 | Tsuruoka ............ H01L 27/3262 |
| 2015/0098036 A1 | 4/2015 | Saitou |
| 2017/0352834 A1 | 12/2017 | Kim |

FOREIGN PATENT DOCUMENTS

| JP | 2012-191015 | 10/2012 |
| JP | 2015-76486 | 4/2015 |
| JP | 2016-31499 | 3/2016 |

* cited by examiner

*Primary Examiner* — Quoc D Hoang
(74) *Attorney, Agent, or Firm* — Oblon, McClelland, Maier & Neustadt, L.L.P.

(57) ABSTRACT

A display device according to an embodiment of the present invention includes: on a substrate: an IC having a first and a second terminal array; a wiring layer having a first and a second electrode array, and a first organic layer having a covering part covering at least a part of a peripheral edge part of each of the first and the second electrode array; an electrically conductive film electrically connecting the first terminal array and the first electrode array, and the second terminal array and the second electrode array; a second organic layer provided in at least a part of an area between the covering part of the first electrode array and the covering part of the second electrode array, the electrically conductive film has a smaller thickness at a position above the second organic layer than at a position of the covering part of the first organic layer.

20 Claims, 10 Drawing Sheets

ELECTRONIC DEVICE INCLUDING AN IC

CROSS-REFERENCE TO RELATED APPLICATION

The present application is a continuation of U.S. application Ser. No. 16/195,892 filed Nov. 20, 2018, and claims priority from Japanese application JP2017-226875A filed on Nov. 27, 2017, the content of each of which is hereby incorporated by reference into this application.

BACKGROUND OF THE INVENTION

1. Field of the Invention

The present invention relates to a display device and particularly relates to a structure on a substrate of a display device.

2. Description of the Related Art

According to the related art, an organic EL (electroluminescence) display device is known in which an organic EL (electroluminescence) material is used for a light emitting element (organic EL element) of a display unit. Unlike a liquid crystal display device or the like, the organic EL display device is a so-called self-emitting display device which causes the organic EL material to emit light to achieve a display.

Recently, for such an organic EL display device, the development of a flexible display in which a resin film such as a polyimide film or the like is used for the substrate of a display panel so as to enable the display panel to be curved has been underway (for example, JP2016-031499A).

SUMMARY OF THE INVENTION

In the organic EL display device that can be curved as described above, at least a part of peripheral edges of first and second electrode arrays provided on wirings of the substrate is covered with an organic film in order to protect the electrodes. The first and second electrode arrays and first and second terminal arrays of a driver IC are electrically connected together by a resin composition containing an electrically conductive material. That is, the resin composition containing the electrically conductive material, which is fluid, is provided between the driver IC and the substrate and hardened at the time of press bonding (for example, JP2015-076486A and JP2012-191015A).

However, in the area between the organic films where the first and second electrode arrays are provided, the resin composition containing the electrically conductive material remains and becomes hardened. Therefore, a stable electrical connection between the terminal arrays and the electrode arrays is not secured.

Thus, an object of the invention is to reduce the residue of the resin composition containing the electrically conductive material and to provide a display device in which a stable electrical connection between the terminals and the electrodes is achieved.

A display device according to an embodiment of the present invention includes: on a substrate: an IC having, on a surface, a first terminal array and a second terminal array opposite each other and spaced apart from each other; a wiring layer having, on a surface, a first electrode array and a second electrode array opposite each other and spaced apart from each other, and a first organic layer having a covering part which covers at least a part of a peripheral edge part of each of the first electrode array and the second electrode array; an electrically conductive film which is situated between the IC and the wiring layer, electrically connects the first terminal array and the first electrode array, and electrically connects the second terminal array and the second electrode array; and a second organic layer provided in at least a part of an area between the covering part covering at least a part of the peripheral edge part of the first electrode array and the covering part covering at least a part of the peripheral edge part of the second electrode array, the electrically conductive film has a smaller thickness at a position above the second organic layer than at a position of the covering part of the first organic layer.

In one embodiment of the present invention, a thin film transistor and a light emitting element situated on a side opposite to the substrate of the thin film transistor are arranged on the substrate, the light emitting element has a pixel electrode, a light emitting layer, and a common electrode, on the thin film transistor side of the pixel electrode, a flattening layer made of an organic material is situated in contact with the pixel electrode, and the first organic layer and the flattening layer are made of the same material.

In one embodiment of the present invention, a plurality of pixels having a light emitting element, and an insulation layer made of an organic material and partitioning the plurality of pixels, are situated on the substrate, and the second organic layer and the insulation layer are made of the same material.

In one embodiment of the present invention, the electrically conductive film is an anisotropic conductive film which is a resin composition containing an electrically conductive material.

A display device according to an embodiment of the present invention includes: a substrate having a plurality of pixels; a first electrode array situated on the substrate; a second electrode array situated on the substrate and spaced apart from and opposite the first electrode array; an IC connecting to the first electrode array and the second electrode array; a first organic layer situated between the first electrode array and the second electrode array; a second organic layer situated between the first organic layer and the IC; a light emitting element provided in the pixel and having a pixel electrode, a light emitting layer, and a common electrode; a flattening layer situated in contact with the pixel electrode, on the substrate side of the pixel electrode, and made of an organic material; and an insulation layer made of an organic material and partitioning the plurality of pixels, the first organic layer and the flattening layer are in the same layer, and the second organic layer and the insulation layer are in the same layer.

DETAILED DESCRIPTION OF THE INVENTION

Figure 1:
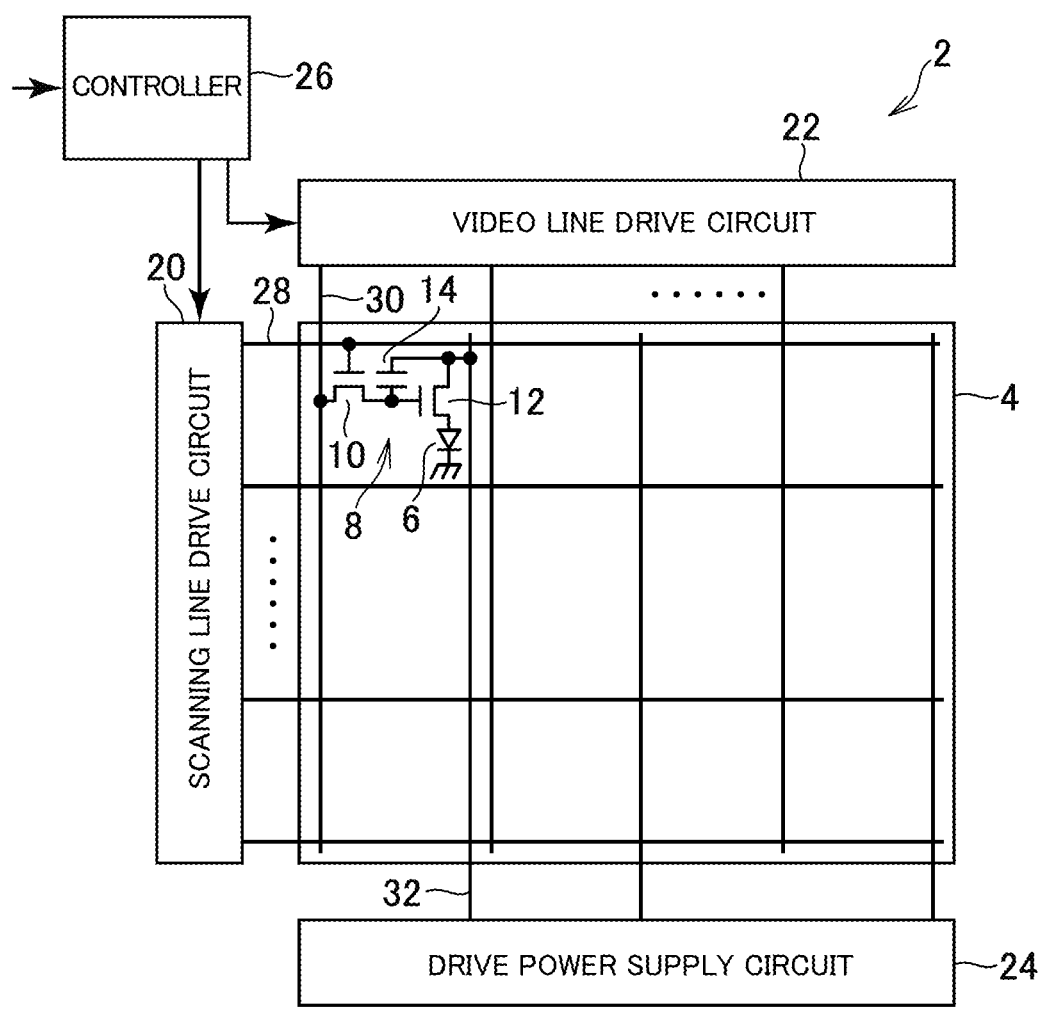
FIG. 1 is a schematic view showing a schematic configuration of an organic EL display device according to an embodiment of the invention.

Hereinafter, embodiments of the invention will be described based on the drawings. The disclosed embodiments are merely examples, and appropriate variations within the spirit of the present invention that can be easily arrived at by those skilled in the art are naturally included in the scope of the present invention. Further, while the width, thickness, shape, and the like of each part in the drawings may be illustrated schematically as compared with actual embodiments in order to clarify the explanation, these are merely examples and an interpretation of the present invention should not be limited thereto. Furthermore, in the specification and respective drawings, the same reference symbols may be applied to elements similar to those that have already been illustrated in another drawing and a detailed explanation of such elements may be omitted as appropriate.

A display device according to an embodiment of the invention is an organic EL display device. The organic EL display device is an active-matrix display device and installed in a television, personal computer, mobile terminal, mobile phone or the like.

FIG. 1 is a schematic view showing a schematic configuration of an organic EL display device 2 according to an embodiment of the invention. The organic EL display device 2 has a pixel array unit 4 which has a plurality of pixels and displays an image, and a drive unit which drives the pixel array unit 4. The organic EL display device 2 has a substrate 80. The substrate 80 is made of a polyimide resin, polyethylene terephthalate or the like and is pliable. Therefore, the organic EL display device 2 is bendable. In this embodiment, for example, any substrate that is pliable such as a very thin glass substrate can be employed in place of the substrate 80.

On the substrate 80, a multilayer structure including a thin film transistor (TFT), an organic light-emitting diode (OLED) and the like is formed.

In the pixel array unit 4, an OLED 6 and a pixel circuit 8 corresponding to each pixel are arranged in the form of a matrix. The pixel circuit 8 is made up of a plurality of TFTs 10, 12 and a capacitor 14.

The drive unit includes a scanning line drive circuit 20, a video line drive circuit 22, a drive power supply circuit 24, and a controller 26. The drive unit drives the pixel circuit 8 and controls the light emission of the OLED 6.

The scanning line drive circuit 20 is connected to a scanning signal line 28 provided for each horizontal array of pixels (pixel row). The scanning line drive circuit 20 selects each scanning signal line 28 in order, in response to a timing signal inputted from the controller 26. The scanning line drive circuit 20 applies a voltage to the selected scanning signal line 28 to turn on the lighting TFT 10.

The video line drive circuit 22 is connected to a video signal line 30 provided for each vertical array of pixels (pixel column). The video line drive circuit 22 has a video signal inputted from the controller 26 and outputs to each video signal line 30 a voltage corresponding to the video signal for the selected pixel row according to the selection of the scanning signal line 28 by the scanning line drive circuit 20. The voltage is written into the capacitor 14 via the lighting TFT 10. The drive TFT 12 supplies a current corresponding to the written voltage, to the OLED 6. This causes the OLED 6 of the pixel corresponding to the selected scanning signal line 28 to emit light.

The drive power supply circuit 24 is connected to a drive power supply line 32 provided for each pixel column and supplies a current to the OLED 6 via the drive power supply line 32 and the drive TFT 12 in the selected pixel row.

A lower electrode of the OLED 6 is connected to the drive TFT 12. Meanwhile, an upper electrode of each OLED 6 is formed of an electrode that is common among the OLEDs 6 of all the pixels. If the lower electrode is formed as an anode, a high electric potential is inputted to the lower electrode, and the upper electrode is a cathode, to which a low electric potential is inputted. If the lower electrode is formed as a cathode, a low electric potential is inputted to the lower electrode, and the upper electrode is an anode, to which a high electric potential is inputted.

Figure 2:
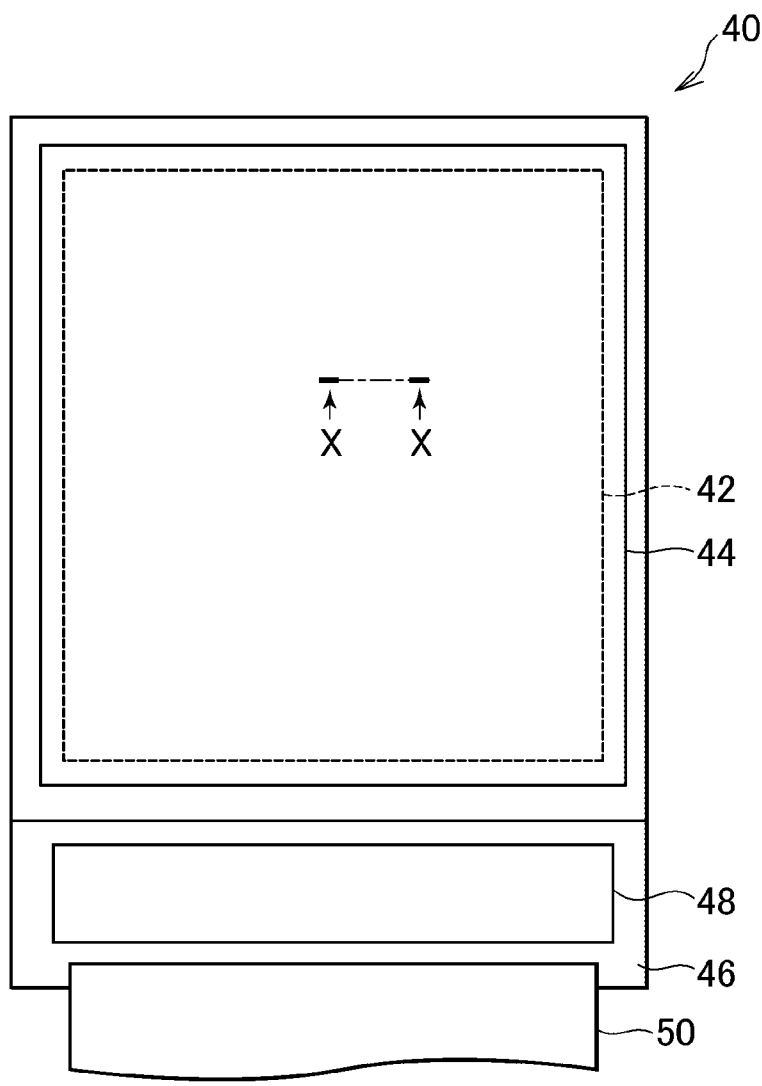
FIG. 2 is a schematic plan view showing a display panel according to an embodiment of the invention.

FIG. 2 is a schematic plan view showing a display panel 40 of the organic EL display device 2. In a display area 42 of the display panel 40, the pixel array unit 4 shown in FIG. 1 is provided and the OLED is arrayed in the pixel array unit 4 as described above. Also, as described above, an upper electrode 44 forming the OLED 6 is formed to be common among the respective pixels and covers the entirety of the display area 42.

Figure 10:
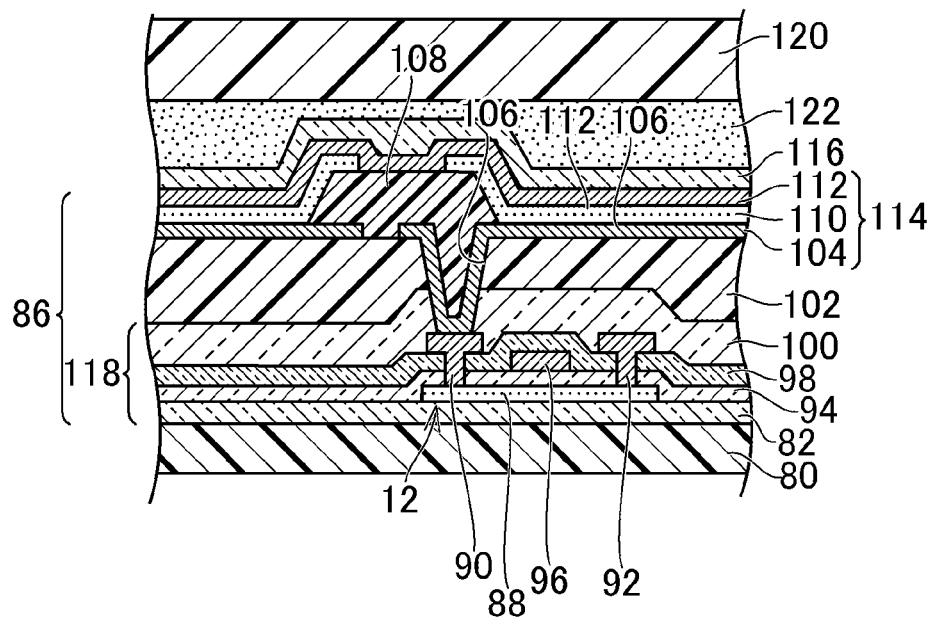
FIG. 10 is a schematic vertical cross-sectional view showing the organic EL display device, taken along X-X shown in FIG. 2.

FIG. 10 is a schematic vertical cross-sectional view showing the organic EL display device, taken along X-X shown in FIG. 2. A display circuit layer 86 made up of a plurality of layers is stacked on the surface of the substrate 80. The display circuit layer 86 includes an underlying layer 82 that serves as a barrier against impurities contained in the substrate 80. The underlying layer 82 is made of an inorganic insulating material such as silicon oxide ($SiO_x$) or silicon nitride ($SiN_y$) and may be a multilayer structure including such materials. A semiconductor layer 88 is formed on the underlying layer 82. A source electrode 90 and a drain electrode 92 are electrically connected to the semiconductor layer 88. A gate insulation film 94 is formed, covering the semiconductor layer 88. The gate insulation film 94, too, is made of an inorganic insulating material. A gate electrode 96 is formed on the gate insulation film 94. An interlayer insulation film 98 is formed, covering the gate electrode 96. The interlayer insulation film 98, too, is made of an inorganic insulating material. The source electrode 90 and the drain electrode 92 penetrate the gate insulation film 94 and the interlayer insulation film 98. The semiconductor layer 88, the source electrode 90, the drain electrode 92, and the gate electrode 96 form at least a part of the drive TFT 12. A passivation film 100 is provided, covering the drive TFT 12. The passivation film 100, too, is made of an inorganic insulating material.

A flattening layer 102 is provided on the passivation film 100. On the flattening layer 102, a plurality of pixel electrodes 104 (lower electrodes, for example, anodes) is provided corresponding to each of a plurality of pixels (sub-pixels). The flattening layer 102 is formed in such a way that at least a surface where the pixel electrode 104 is formed is flat. The flattening layer 102 is an organic layer made of an organic material. As the organic material used for the flattening layer 102, a photosensitive acrylic resin or the like is used. The pixel electrode 104 is electrically connected to one of the source electrode 90 and the drain electrode 92 on the semiconductor layer 88 via a contact hole 106 penetrating the flattening layer 102 and the passivation film 100.

An insulation layer 108 is formed on the flattening layer 102 and the pixel electrode 104. The insulation layer 108 is an organic layer made of an organic material. As the organic material used for the insulation layer 108, a photosensitive acrylic resin or the like is used. The insulation layer 108 is formed in such a way as to be placed on a peripheral edge of the pixel electrode 104 and to open a part (for example, a center part) of the pixel electrode 104. The insulation layer 108 forms a bank surrounding a part of the pixel electrode. That is, the insulation layer 108 marks off a plurality of pixels arranged in the display area 42 shown in FIG. 2.

A light emitting layer 110 is provided on the pixel electrode 104. The light emitting layer 110 provided individually (separately) for each pixel electrode 104 and emits light in blue, red or green, corresponding each pixel. The color corresponding to each pixel is not limited thereto. For example, yellow, or white or the like may be added. The light emitting layer 110 is formed, for example, by vapor deposition. Alternatively, the light emitting layer 110 may be formed over a plurality of pixels, on the entire surface covering the display area 42 shown in FIG. 2. That is, the light emitting layer 110 may be formed in such a way as to continue on the insulation layer 108. In this case, the light emitting layer 110 is formed by coating via solvent dispersion. If the light emitting layer 110 is formed over a plurality of pixels, the light emitting layer 110 emits light in white at all the subpixels and a desired color wavelength portion is extracted through a color filter, not illustrated.

A common electrode 112 (upper electrode, for example, a cathode) is provided on the light emitting layer 110. The common electrode 112 is placed on the insulation layer 108 serving as a bank. The common electrode 112 continues above the neighboring pixel electrodes 104. The light emitting layer 110 is placed between the pixel electrode 104 and the common electrode 112 and emits light with its luminance controlled by a current flowing between these two electrodes. At least one of a hole transport layer and a hole injection layer, not illustrated, may be provided between the light emitting layer 110 and the pixel electrode 104. At least one of an electron transport layer and an electron injection layer, not illustrated, may be provided between the light emitting layer 110 and the common electrode 112. The pixel electrode 104, the light emitting layer 110, and the common electrode 112 form at least a part of a light emitting element 114.

A sealing layer 116 covers a plurality of light emitting elements 114. The sealing layer 116 shields the light emitting elements 114 from moisture. The sealing layer 116 is made of an inorganic insulating material such as silicon oxide ($SiO_x$) or silicon nitride ($SiN_y$) and may be a multi-layer structure including such materials. For example, a structure having a pair of inorganic films with an organic film such as an acrylic resin held between them may be employed.

The display circuit layer 86 includes at least a plurality of layers below the sealing layer 116 stacked on the substrate 80 and may also include the sealing layer 116. The display circuit layer 86 includes the light emitting element 114, the drive TFT 12, and an inorganic insulation layer 118. The inorganic insulation layer 118 includes at least one of the underlying layer 82, the gate insulation film 94, the interlayer insulation film 98, and the passivation film 100.

A film 120 is bonded to the display circuit layer 86. A filling layer 122 is provided between the film 120 and the display circuit layer 86. The film 120 is light-transmissive and transparent so as to display an image. The film 120 is an optically clear film or a polarizer.

First Example

Figure 3:
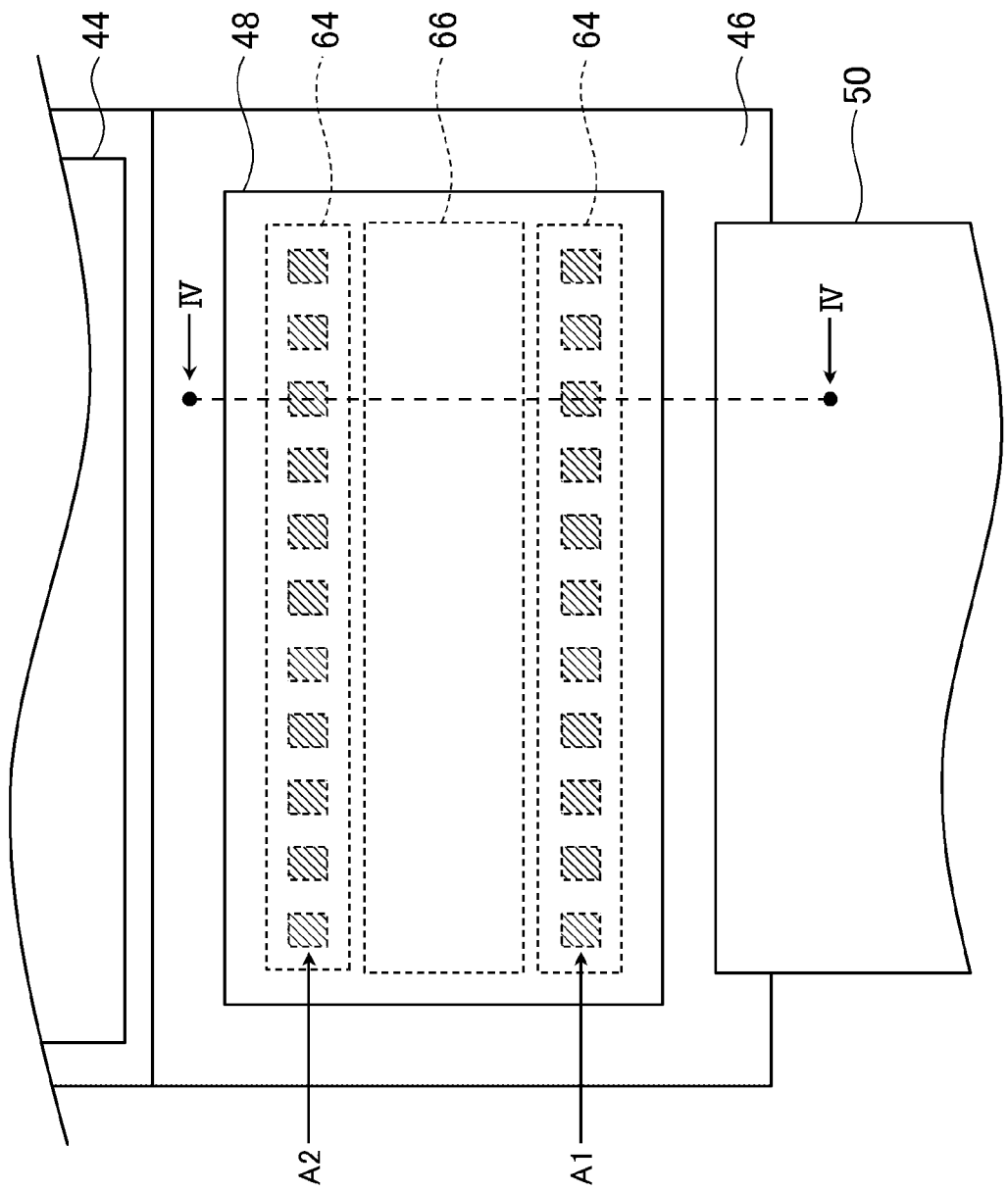
FIG. 3 is a schematic plan view showing a configuration in a component loading area of an organic EL display device according to a first example of the invention.

A first example of the invention will be described with reference to FIGS. 3 and 4. FIG. 3 is a schematic plan view showing a configuration in a component loading area 46 of the organic EL display device 2 according to a first example of the invention. On one side of the rectangular display panel 40, the component loading area 46 is provided, where a wiring layer 84 connected to the display circuit layer 86 in the display area 42 is arranged. In the component loading area 46, a driver IC 48 (also referred to simply as IC) forming the drive unit is installed. Alternatively, a flexible printed circuit board (FPC) 50 is connected to the component loading area 46. The FPC 50 is also connected to the controller 26 and other circuits 20, 22, 24 or the like.

The wiring layer 84 has two or more electrode arrays, each including electrodes 60 arranged in a line to electrically connect to the driver IC 48. Of these electrode arrays, at least two arrays (first electrode array A1 and second electrode array A2 in FIG. 3) are opposite each other and spaced apart from each other. Also, a peripheral edge part of the electrode 60 provided in the wiring layer 84 is at least partly covered with a first organic layer 64. The first organic layer 64 for covering the electrode 60 may use the flattening layer 102 shown in FIG. 10. If the flattening layer 102 is used to provide the first organic layer 64, the first organic layer 64 may be provided in the same layer as the flattening layer 102, or the first organic layer 64 may be formed simultaneously with the flattening layer 102, using the same material. Alternatively, a layer of an organic material may be newly provided. The material forming the first organic layer 64, when newly provided, is not particularly limited, provided that it is an organic material. For example, an acrylic polymer, amorphous fluoropolymer, epoxy resin, polyimide resin or the like may be employed.

In the area between the first organic layers 64, a second organic layer 66 that is different from the first organic layers 64 is provided. The second organic layer 66 may use the insulation layer 108 (bank) shown in FIG. 10. If the insulation layer 108 is used to provide the second organic layer 66, the second organic layer 66 may be provided in the same layer as the insulation layer 108, or the second organic layer 66 may be formed simultaneously with the insulation layer 108, using the same material. Alternatively, a layer of an organic material may be newly provided. The material forming the second organic layer 66, when newly provided, is not particularly limited, provided that it is not the organic material forming the first organic layer 64. For example, an acrylic polymer, amorphous fluoropolymer, epoxy resin, polyimide resin or the like may be employed.

Figure 4:
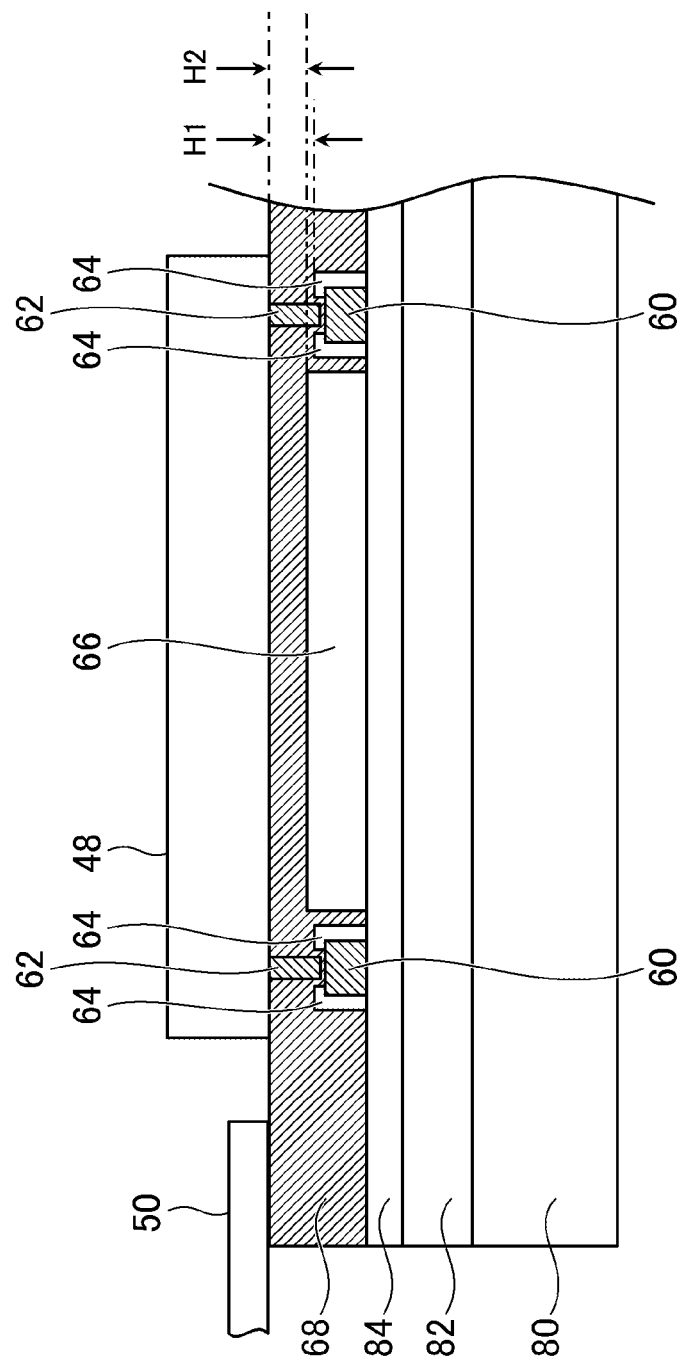
FIG. 4 is a schematic vertical cross-sectional view showing a display panel, taken along IV-IV shown in FIG. 3.

FIG. 4 is a schematic vertical cross-sectional view showing the component loading area 46, taken along IV-IV shown in FIG. 3. Between the wiring layer 84 formed on the underlying layer 82 and the electrode 60 provided on the wiring layer 84, and the driver IC 48, an electrically conductive film, for example, an anisotropic conductive film 68 which is a resin composition containing an electrically conductive material, is arranged. This is carried out for press bonding and connection by arranging the anisotropic conductive film 68 containing a number of electrically conductive particles, between a terminal 62 of the driver IC 48 and the electrode 60 provided on the wiring layer 84. This is known as a technique for installing the driver IC 48 onto the display panel 40 of the organic EL display device 2. The electrically conductive particles contained in the anisotropic conductive film 68 are crushed between the terminal 62 and the electrode 60. Thus, an electrical connection is provided.

The thickness H2 of the anisotropic conductive film 68 in the area on the second organic layer 66 is thinner than the thickness H1 of the anisotropic conductive film 68 supported at the part where the first organic layer 64 covers the peripheral edge part of the electrode 60. That is, the height of the anisotropic conductive film 68 supported in the area on the second organic layer 66 (height at the position where the anisotropic conductive film 68 is in contact with the upper surface of the second organic layer 66) is higher than the height of the anisotropic conductive film 68 supported at the part where the first organic layer 64 covers the peripheral edge part of the electrode 60 (height at the position where the anisotropic conductive film 68 is in contact with the upper surface of the first organic layer 64). That is, the position where the anisotropic conductive film 68 is in contact with the upper surface of the second organic layer 66 is at a longer distance from the substrate 80 than the position where the anisotropic conductive film 68 is in contact with the upper surface of the first organic layer 64.

By employing such a configuration, it is possible to reduce the residue of the anisotropic conductive film 68 in the area between the first organic layers 64 when installing the driver IC 48 onto the display panel 40 of the organic EL display device 2. Thus, a stable electrical connection between the terminal 62 and electrode 60 is achieved.

Figure 5:
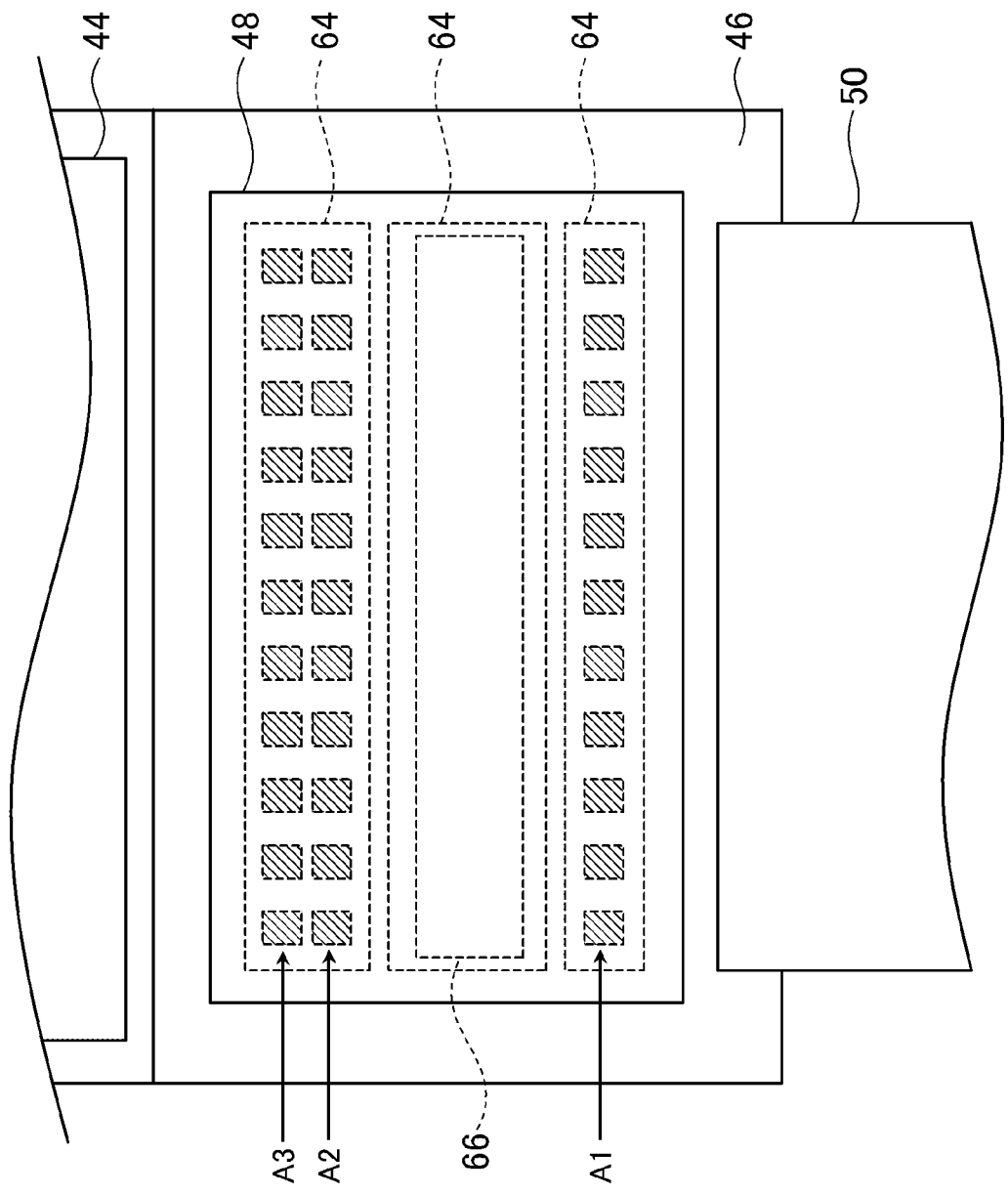
FIG. 5 is a schematic plan view showing a configuration in a component loading area of an organic EL display device according to a modification of the first example.

FIG. 5 is a schematic plan view showing a configuration in the component loading area 46 of the organic EL display device 2 according to a modification of the first example. In addition to the first electrode array A1 and the second electrode array A2 opposite each other and spaced apart from each other, a third electrode array A3 as shown in FIG. 5 may be provided. In this case, the third electrode array A3 is provided in an area that is not the space between the first electrode array A1 and the second electrode array A2.

Second Example

Figure 6:
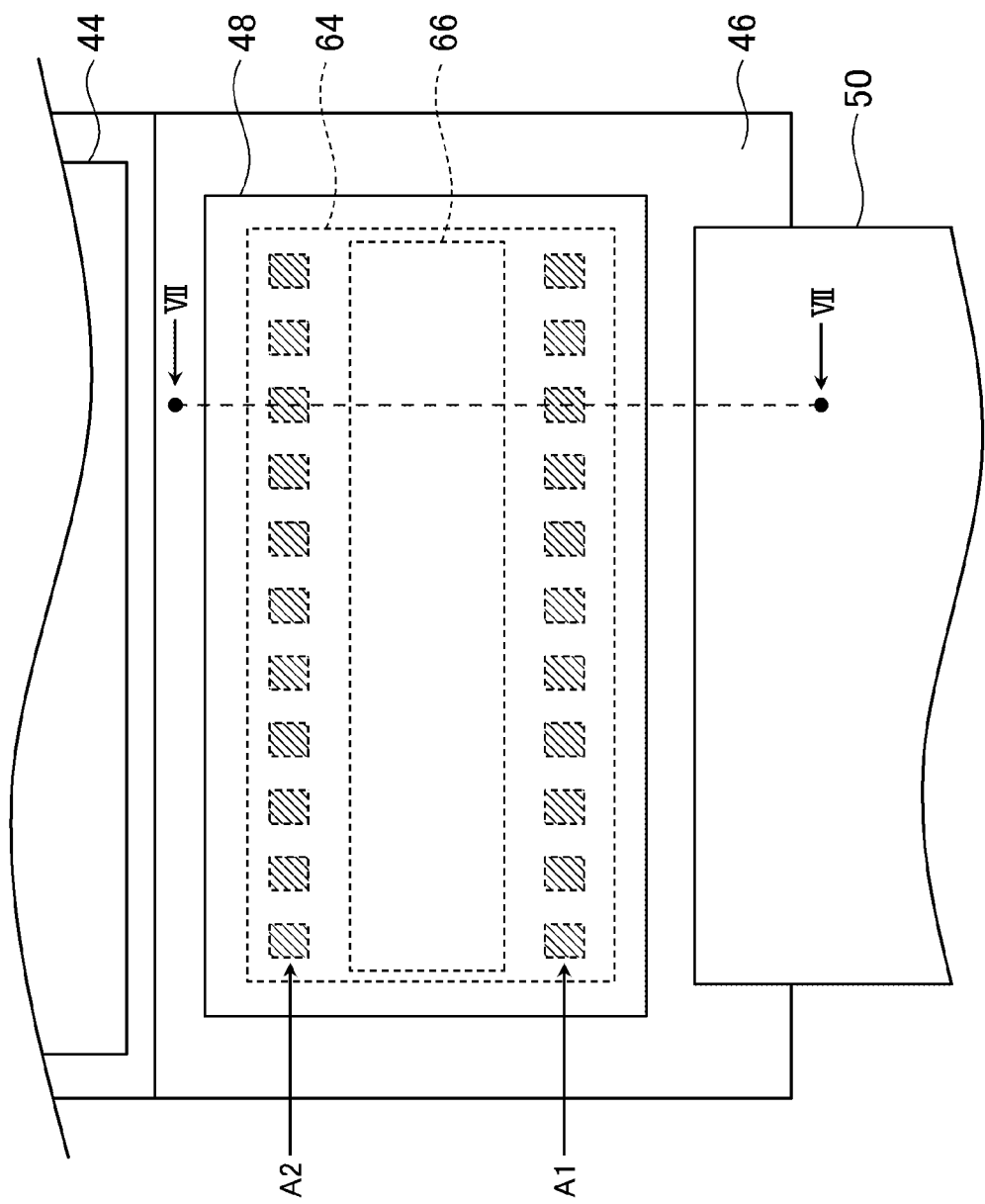
FIG. 6 is a schematic plan view showing a configuration in a component loading area of an organic EL display device according to a second example of the invention.

Next, a second example of the invention will be described with reference to FIGS. 6 and 7. Components similar to those in the first example will not be described further in detail. FIG. 6 is a schematic plan view showing a configuration in the component loading area 46 of the organic EL display device 2 according to the second example of the invention. In this example, the first organic layer 64 covering at least a part of the peripheral edge part of the electrode 60 is also provided between the first electrode array A1 and the second electrode array A2. The second organic layer 66 is provided on the first organic layer 64.

Figure 7:
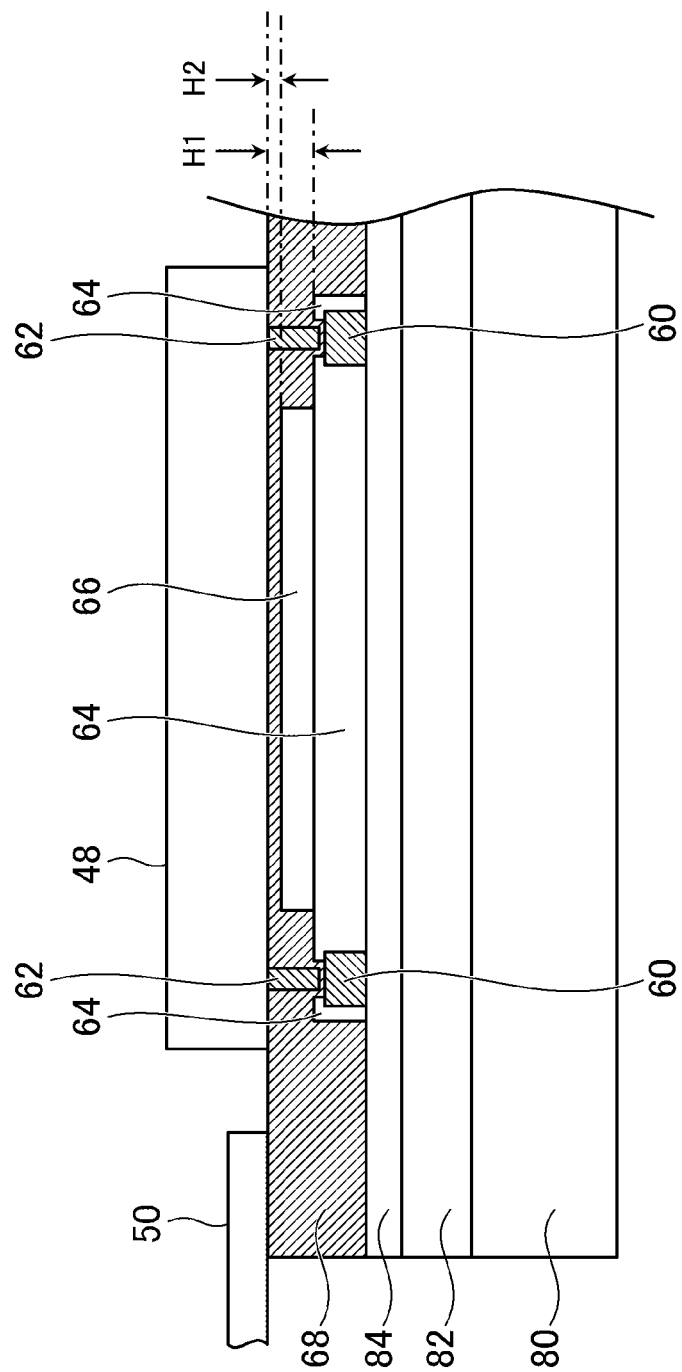
FIG. 7 is a schematic vertical cross-sectional view showing a display panel, taken along VII-VII shown in FIG. 6.

FIG. 7 is a schematic vertical cross-sectional view showing the component loading area 46, taken along VII-VII shown in FIG. 6. In the first example, the anisotropic conductive film 68 is present at both ends of the area between the first organic layers 64, whereas in this example, the first organic layer 64 is provided also in that area.

The thickness H2 of the anisotropic conductive film 68 in the area on the second organic layer 66 is thinner than the thickness H1 of the anisotropic conductive film 68 supported at the part where the first organic layer 64 covers the peripheral edge part of the electrode 60. That is, the height of the anisotropic conductive film 68 supported in the area on the second organic layer 66 is higher than the height of the anisotropic conductive film 68 supported at the part where the first organic layer 64 covers the peripheral edge part of the electrode 60. This configuration enables further reduction of the residue of the anisotropic conductive film 68 in the area between the first organic layers 64. Thus, a stable electrical connection between the terminal 62 and electrode 60 is achieved.

Third Example

Figure 8:
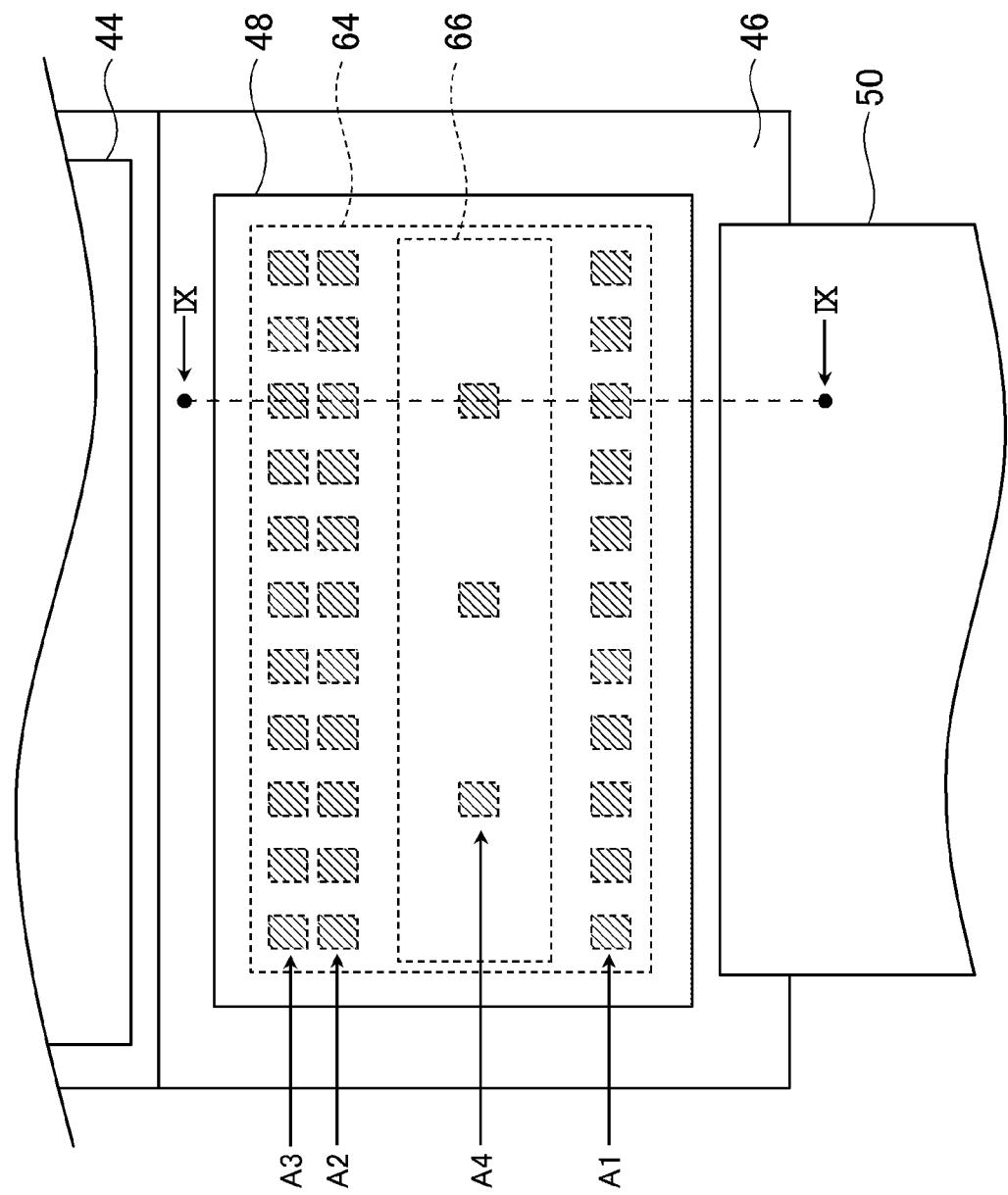
FIG. 8 is a schematic plan view showing a configuration in a component loading area of an organic EL display device according to a third example of the invention.

Next, a third example of the invention will be described with reference to FIGS. 8 and 9. Similarly, components similar to those in the first example will not be described further in detail. FIG. 8 is a schematic plan view showing a configuration in the component loading area 46 of the organic EL display device 2 according to the third example of the invention. In this example, in the area between the first electrode array A1 and the second electrode array A2, a dummy terminal 72 is provided as a support to prevent the driver IC 48 from warping. While the dummy terminal 72 is not necessarily provided for electrical connection, the wiring layer 84 is provided with a dummy terminal electrode array A4 having a dummy terminal electrode 70 to connect to the dummy terminal 72. The dummy terminal electrode 70 may be electrically floating.

Also, in this example, the first organic layer 64 is provided in the area between the first and second electrode arrays excluding the dummy terminal electrode 70 connect to the dummy terminal 72. The second organic layer 66 is provided on the first organic layer 64 in this area.

Figure 9:
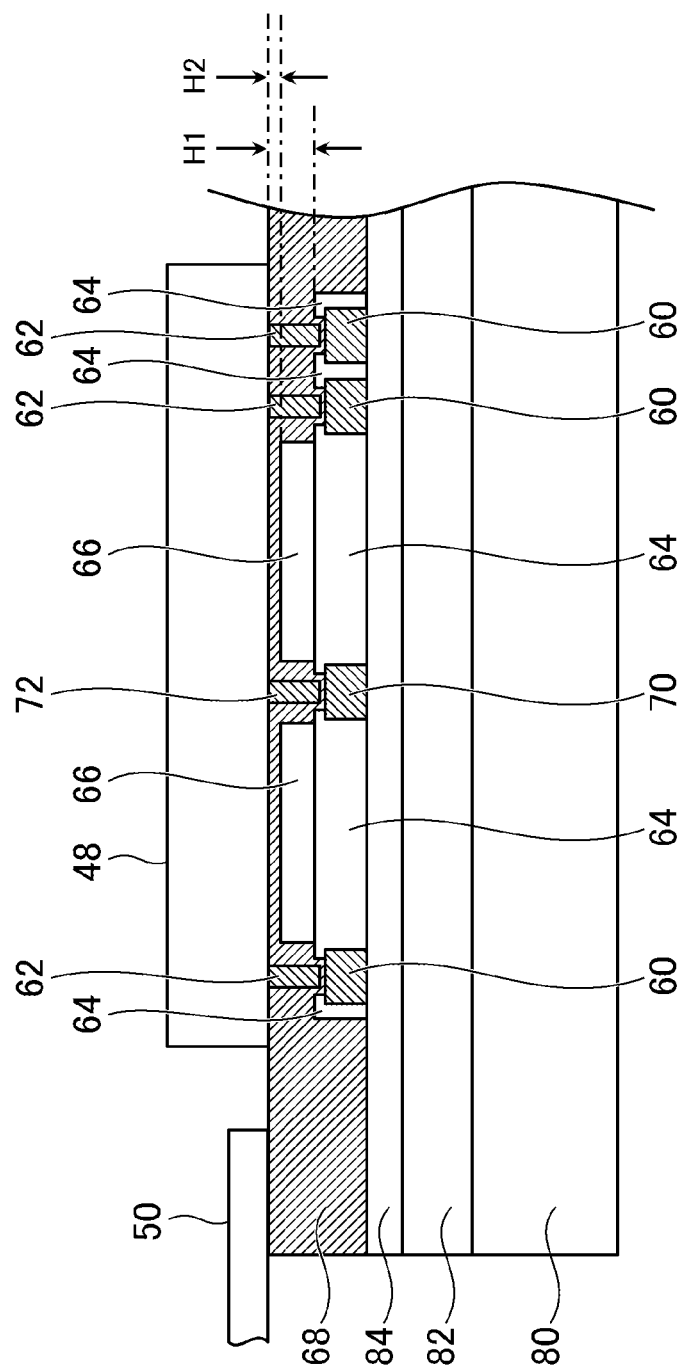
FIG. 9 is a schematic vertical cross-sectional view showing a display panel, taken along IX-IX shown in FIG. 8.

FIG. 9 is a schematic vertical cross-sectional view showing the component loading area 46, taken along IX-IX shown in FIG. 8. In this example, as in the second example, the first organic layer 64 is also provided between the first electrode array A1 and the second electrode array A2.

The thickness H2 of the anisotropic conductive film 68 in the area on the second organic layer 66 is thinner than the thickness H1 of the anisotropic conductive film 68 supported at the part where the first organic layer 64 covers the peripheral edge part of the electrode 60. That is, the height of the anisotropic conductive film 68 supported in the area on the second organic layer 66 is higher than the height of the anisotropic conductive film 68 supported at the part where the first organic layer 64 covers the peripheral edge part of the electrode 60. This configuration enables reduction of the residue of the anisotropic conductive film 68 in the area between the first organic layers 64 regardless of whether the dummy terminal 72 is present or not. Thus, a stable electrical connection between the terminal 62 and electrode 60 is achieved.

Any addition, deletion or design change of a component, or any addition, deletion or condition change of a process that is made by a person skilled in the art based on the display device described as the embodiments and examples of the invention and that has essential features of the invention, is included in the scope of the invention. The embodiments and examples can be combined together unless such combination generates a together technical contradiction.

Any advantageous effect that is different from the advantageous effects achieved by the embodiment but is clear from the description in this specification or can be properly thought of by a person skilled in the art are brought about by the invention.

What is claimed is:

1. An electronic device comprising:
a substrate;
an IC including a first terminal array including first terminals and a second terminal array including second terminals, and located on the substrate, the first terminal array facing the second terminal array via a space;
a first electrode array including first electrodes formed on the substrate and facing the first terminal array in a direction intersecting a main surface of the substrate;
a second electrode array including second electrodes formed on the substrate and facing the second terminal array in the direction;
a first organic layer covering a part of each of the first electrodes and a part of each of the second electrodes;
an electrically conductive film formed between the IC and the first and second electrode arrays, electrically connecting the first electrodes to the first terminals, and electrically connecting the second electrodes to the second terminals; and
a second organic layer formed between the first electrode array and the second electrode array,
wherein the electrically conductive film has a smaller thickness at a position above the second organic layer than at a position overlapping one of the first electrode array and second electrode array.

2. The electronic device according to claim 1, wherein the first electrode array and the second electrode array faces the first terminal array and the second terminal array respectively in a vertical direction of the main surface.

3. The electronic device according to claim 1, wherein each of the first and second electrodes has an upper surface, and
the first organic layer coves an edge of the upper surface.

4. The electronic device according to claim 3, wherein each of the first and second electrodes has a side surface intersecting the upper surface, and
the first organic layer coves the side surface.

5. The electronic device according to claim 3, wherein the first organic layer includes a first region covering the edge of the upper surface,
the electrically conductive film includes a second region between the IC and the second organic layer, and a third region between the IC and the first region, and
the second region is thinner than the third region.

6. The electronic device according to claim 1, wherein the electrically conductive film is an anisotropic conductive film.

7. The electronic device according to claim 1, wherein the electrically conductive film includes a first position in contact with an upper surface of the first organic layer, and a second position in contact with an upper surface of the second organic layer, and
a distance between the substrate and the second position is smaller than a distance between the substrate and the first position.

8. The electronic device according to claim 1, wherein the first organic layer includes a portion formed between the first electrode array and the second electrode array, and
the second organic layer is formed on the portion.

9. The electronic device according to claim 8, wherein the portion is in contact with a side surface of at least one of the first electrodes and a side surface of at least one of the second electrodes.

10. The electronic device according to claim 1, wherein at least one electrode overlapping the IC is formed between the first electrode array and the second electrode array, and the second organic layer includes a first portion between the first electrode array and the at least one electrode, and a second portion between the second electrode array and the at least one electrode.

11. The electronic device according to claim 10, wherein the second organic layer surrounds the at least one electrode in a plan view.

12. The electronic device according to claim 10, wherein the first organic layer includes a third portion between the first electrode array and the at least one electrode, and a fourth portion between the second electrode array and the at least one electrode,
the first portion is on the third portion, and
the second portion is on the fourth portion.

13. The electronic device according to claim 10, wherein the at least one electrode is electrically floating.

14. The electronic device according to claim 10, wherein the at least one electrode is electrically connected to a terminal of the IC.

15. The electronic device according to claim 10, wherein the at least one electrode includes a plurality of electrodes arranged in a line, and
the first electrodes, the second electrodes, and the plurality of electrodes are arranged in a same direction.

16. The electronic device according to claim 1, wherein the first organic layer includes a first area and a second area separated from the first area,
the first area surrounds the first electrode array, and
the second area surrounds the second electrode array.

17. The electronic device according to claim 16, wherein the first organic layer includes a third area formed between the first area and the second area and separated from both the first area and the second area, and
the second organic layer is formed on the third area.

18. The electronic device according to claim 1, wherein the first organic layer is formed in one body, and
the first organic layer surrounds both the first electrode array and the second electrode array.

19. An electronic device comprising:
a substrate;
an IC including a first terminal and located on the substrate,
a second terminal formed on the substrate and facing the first terminal;
an electrically conductive film formed between the IC and the second terminal, and electrically connecting the first terminal to the second terminal; and
a second organic layer formed on the substrate, overlapping the IC, and not overlapping the second terminal,
wherein the electrically conductive film includes a first region overlapping the second terminal and a second region overlapping the second organic layer, and
a thickness of the first region is larger than a thickness of the second region.

20. The electronic device according to claim 19, wherein the second terminal has an upper surface,
the upper surface includes a first portion in contact with the electrically conductive film, and a second portion covered with a first organic layer and including an edge of the upper surface,
the electrically conductive film includes a third region overlapping the first organic layer, and
a thickness of the third region is larger than the thickness of the second region.

* * * * *